US009356600B2

(12) United States Patent
Priel et al.

(10) Patent No.: US 9,356,600 B2
(45) Date of Patent: May 31, 2016

(54) IO DRIVER IMPEDANCE CALIBRATION

(75) Inventors: Michael Priel, Netanya (IL); Dan Kuzmin, Givat Shmuel (IL); Sergey Sofer, Rishon Lezion (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/400,743

(22) PCT Filed: May 30, 2012

(86) PCT No.: PCT/IB2012/052696
§ 371 (c)(1),
(2), (4) Date: Nov. 12, 2014

(87) PCT Pub. No.: WO2013/179088
PCT Pub. Date: Dec. 5, 2013

(65) Prior Publication Data
US 2015/0145556 A1 May 28, 2015

(51) Int. Cl.

| | |
|---|---|
| ***H03K 17/16*** | (2006.01) |
| ***H03K 19/003*** | (2006.01) |
| ***H03K 19/0185*** | (2006.01) |
| ***H03K 19/00*** | (2006.01) |
| ***G11C 7/04*** | (2006.01) |
| ***G11C 7/10*** | (2006.01) |
| ***G11C 11/4096*** | (2006.01) |
| ***G11C 29/02*** | (2006.01) |

(52) U.S. Cl.
CPC .......... *H03K 19/018557* (2013.01); *G11C 7/04* (2013.01); *G11C 7/1048* (2013.01); *G11C 11/4096* (2013.01); *G11C 29/022* (2013.01); *G11C 29/028* (2013.01); *H03K 17/16* (2013.01); *H03K 19/0005* (2013.01); *G11C 2207/2254* (2013.01)

(58) Field of Classification Search
None
See application file for complete search history.

(56) References Cited

U.S. PATENT DOCUMENTS

| | | | | |
|---|---|---|---|---|
| 6,064,224 | A | 5/2000 | Esch, Jr. et al. | |
| 6,566,911 | B1 | 5/2003 | Moyer | |
| 6,807,650 | B2 | 10/2004 | Lamb et al. | |
| 6,836,144 | B1 | 12/2004 | Bui et al. | |
| 7,417,452 | B1 * | 8/2008 | Wang et al. | 326/30 |
| 7,928,757 | B2 | 4/2011 | Nguyen et al. | |
| 7,969,181 | B1 | 6/2011 | Fefer et al. | |
| 2009/0295426 | A1 | 12/2009 | Ayyapureddi et al. | |
| 2011/0267100 | A1 | 11/2011 | Koo | |

FOREIGN PATENT DOCUMENTS

WO 2005060193 6/2005

OTHER PUBLICATIONS

International Search Report and Written Opinion correlating to PCT/IB2012/052696 dated Feb. 28, 2013.

* cited by examiner

*Primary Examiner* — Jany Richardson

(57) ABSTRACT

An IO driver for an integrated circuit and a method for calibrating such an IO driver are provided. The IO driver comprises a plurality of IO driver cells, a plurality of IO partial driver cells and an external resistor. The IO driver cells control IO operations for a corresponding plurality of data channels of the integrated circuit. The IO partial driver cells are coupled to respective cells of the plurality of IO driver cells. The external resistor provides a reference impedance. The reference partial driver cell is coupled to the external resistor and is arranged to determine the reference impedance and to provide information depending on the reference impedance to the IO partial driver cells. The IO partial driver cells are arranged to calibrate the respective IO driver cells based on the provided information.

6 Claims, 4 Drawing Sheets

IO DRIVER IMPEDANCE CALIBRATION

FIELD OF THE INVENTION

This invention relates to an input/output (IO) driver with impedance calibration and a method for calibrating an impedance of an IO driver.

BACKGROUND OF THE INVENTION

Reliably transmitting data at high speeds, e.g. between a DRAM device and a memory controller, requires the IO drivers to ensure that the required electrical signaling levels are achieved. On-chip process, voltage and temperature variations can alter the electrical characteristics of the IO driver circuit, resulting in deviations from the desired signaling levels. Deviations in the signaling levels result in reduced timing and voltage margins and therefore in lower data transmission rates, reduced signal integrity and increased power consumption.

From, e.g., U.S. Pat. No. 7,969,181 B1 it is known to use an external resistor as a reference impedance and a calibration circuit to control the impedance of the IO driver to match this reference impedance. A monitoring circuit monitors the driver output and a control circuit adjusts the impedance of the output driver in dependence of the monitoring result.

When one IO pad is spent to calibrate one corresponding reference IO driver cell this way, the other IO driver cells, similar to the first one, can be adjusted to the same required impedance value (see FIG. 1). However, when the IO driver consists of, e.g., a mix of different types of transistors and/or transistor types with high on-chip variation such an approach may not be optimal. Accordingly, it is desired to ensure high frequency signaling while avoiding impedance mismatches in an alternative way.

SUMMARY OF THE INVENTION

The present invention provides an IO driver and a method for calibrating an IO driver as described in the accompanying claims. Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
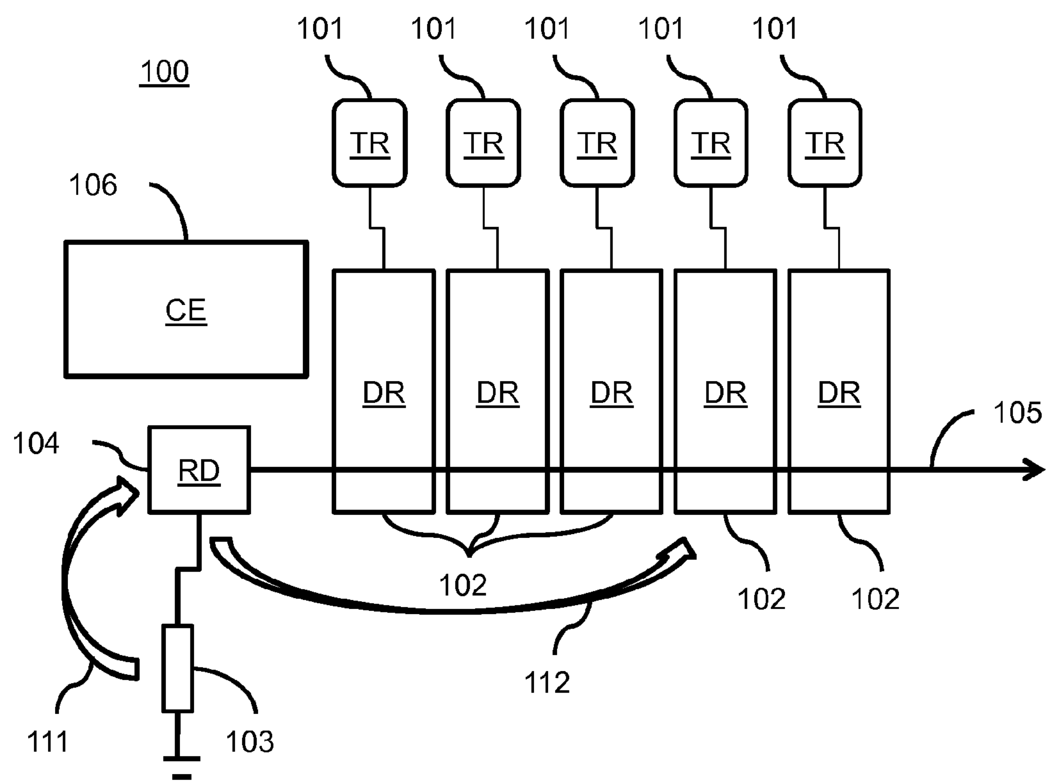
FIG. 1 schematically shows a block diagram of an IO driver with impedance calibration, FIG. 2 schematically shows a block diagram of another IO driver with impedance calibration, FIG. 3 schematically shows a block diagram of yet another IO driver with impedance calibration.

FIG. 1 schematically shows a block diagram of part of an integrated circuit 100. The block diagram shows important components of an IO driver of the integrated circuit 100, including some components that are used for impedance calibration. Here and in the following, 'IO driver' refers to a combination of cooperating circuit elements in the integrated circuit 100, which controls the input and output of data to and from the core circuits 101 of the integrated circuit 100. The IO driver also comprises circuit elements for calibrating the IO driver to be compliant with different in and out protocol requirements for, e.g., IO driver strength or impedance. Below, different embodiments of such IO drivers and of the calibration process are described in detail.

Five circuits 101 composed of transistors for performing some of the core functions of the integrated circuit 100 are coupled to five respective IO driver cells 102 for providing communication of data to and from the core circuits 101. The core circuits 101 may, e.g., be provided for processing or storing data. The core circuits 101 are typically part of a larger network of multiple transistors for performing more complex functions.

In order to calibrate the signaling levels of the IO driver cells 102 a typical calibration circuit is provided. Here and in the following, 'calibration circuit' refers to a combination of cooperating circuit elements in the IO driver, which controls the calibration of the IO driver cells 102. The calibration circuit comprises an external resistor 103 for providing a reference impedance. The external resistor 103 is coupled to a reference driver 104. The reference driver 104 is similar or equal to the IO driver cells 102 and is calibrated 111 to match the reference impedance. Via data bus 105 the calibration settings used for calibrating the reference driver 104 are copied 112 to all IO driver cells 102. The same calibration settings are then used for configuring the IO driver cells 102. The whole calibration process may be controlled by a calibration engine 106 which is coupled to the reference driver 104 and the IO driver cells 102. Alternatively, the calibration is completely controlled by the reference driver 104 and the IO driver cells 102 themselves.

Figure 2:
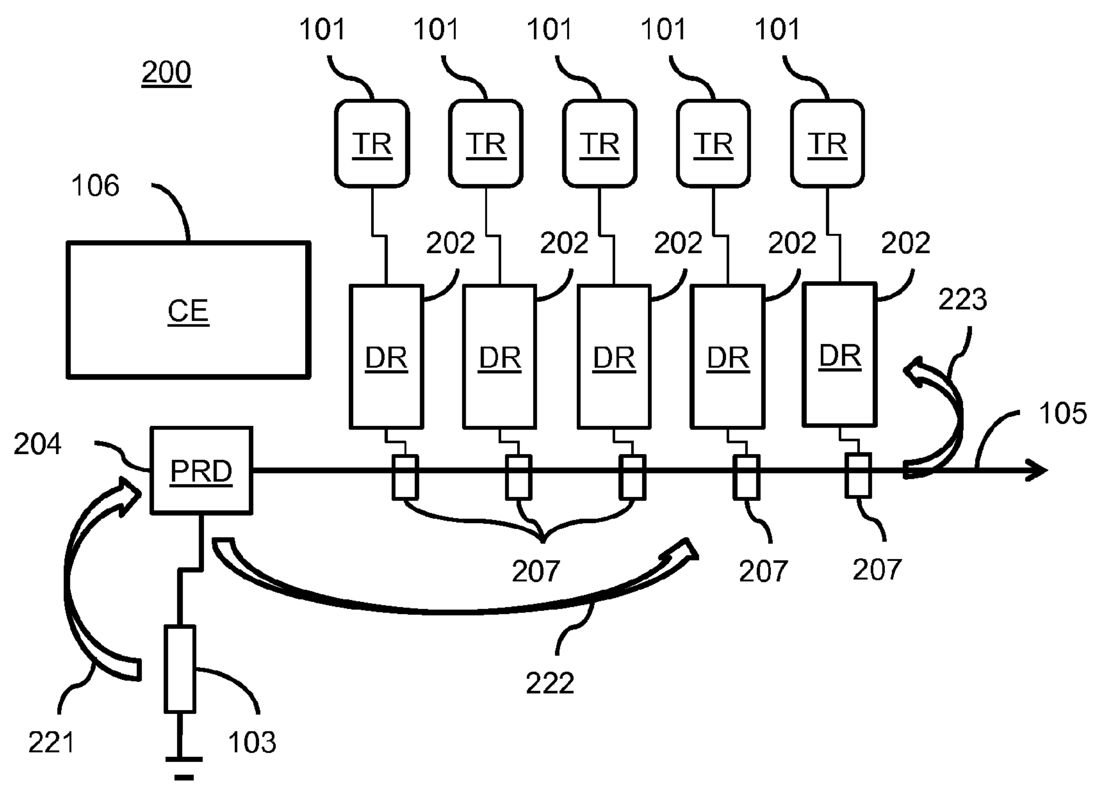

FIG. 2 schematically shows a block diagram of another IO driver with impedance calibration. In this integrated circuit 200, the IO driver cells 202 are designed to comprise transistors with relatively high on-chip variation of their parameters. Such transistor types, especially core or thin oxide transistors allow for increased operating speed and other IO driver parameter improvements. For optimal calibration of the IO driver cells 202, a mere copying of the calibration settings to all IO driver cells 202 as described above with reference to the integrated circuit 100 of FIG. 1 may not be the best solution. Also when, e.g., the temperature at different areas of the integrated circuit 200 varies significantly, better solutions may be desired.

In the IO driver for this integrated circuit 200, a plurality of IO partial driver cells 207 is provided, each IO partial driver cell 207 being coupled to a corresponding IO driver cell 202. A reference partial driver cell 204 is coupled to the external resistor 103. The reference partial driver cell 204 determines 221 the reference impedance of the external resistor 103. The reference impedance or information related to/based on the reference impedance is then copied 222 to the IO partial driver cells 207, via the data bus 105. Then the IO partial driver cells 207 calibrate 223 their respective IO driver cells 202 based on the information received from the reference partial driver cell 204. In this way, the calibration deals with variations in the manufacturing process, changes in the direct environment of the integrated circuit 200 and differences across the integrated circuit 200.

Like before, a calibration engine 106 may be provided for controlling the calibration process. The IO partial driver cells 207 may comprise a different type of transistor than their respective IO driver cells 202. The on-chip variation of the transistor type of the IO partial driver cells 207 is preferably significantly narrower than that of the IO driver cell transistors. For example, the IO driver cells 202 may comprise a thin gate oxide transistor which is more prone to on-chip variations due to smaller dimensions, lower gate capacitance and a higher saturation drain current, while the IO partial driver cells 207 comprise a dual gate oxide transistor. It is to be noted that different data channels may use different types of IO driver cells 202 and/or different types of IO partial driver cells 207.

Figure 3:
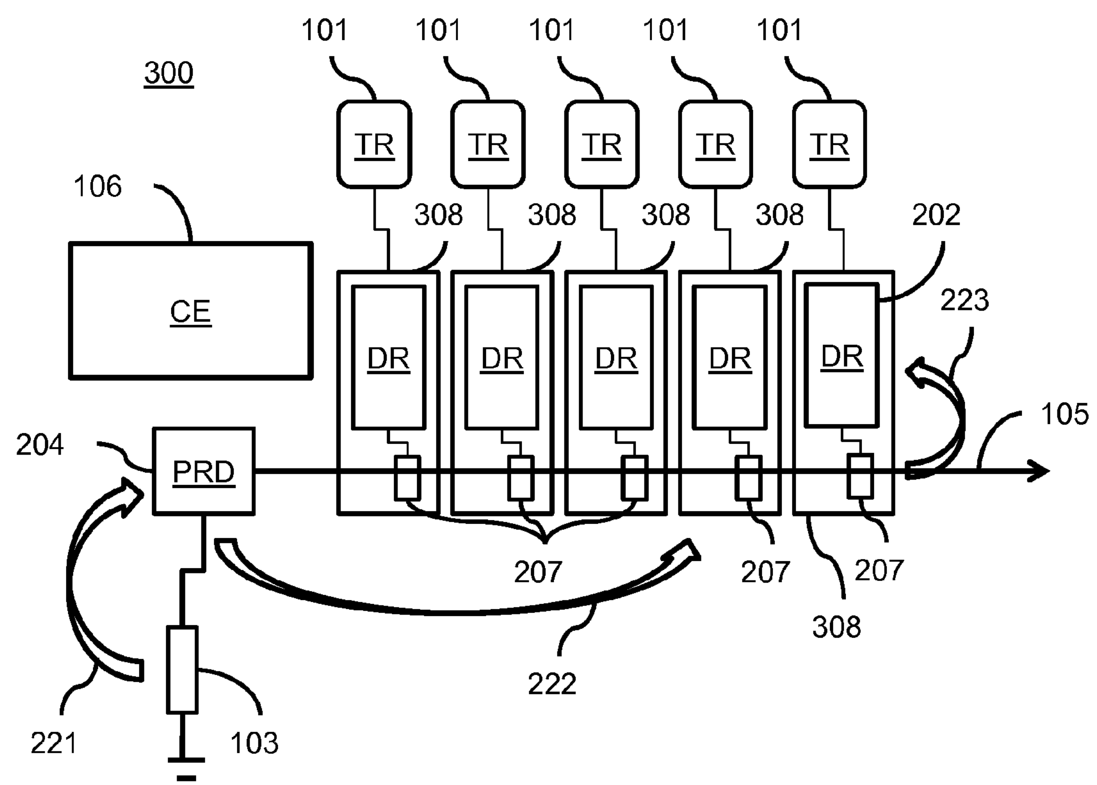

FIG. 3 schematically shows a block diagram of yet another IO driver with impedance calibration. The main difference between the integrated circuit 300 in this figure and in the previous one is that the IO partial driver cells 207 and their respective IO driver cells 202 are together integrated on a single integrated driver circuit 308. It is to be noted that the integration of both elements 202, 308 on the same integrated driver circuit 308 does not prohibit the use of different transistor types.

Figure 4:
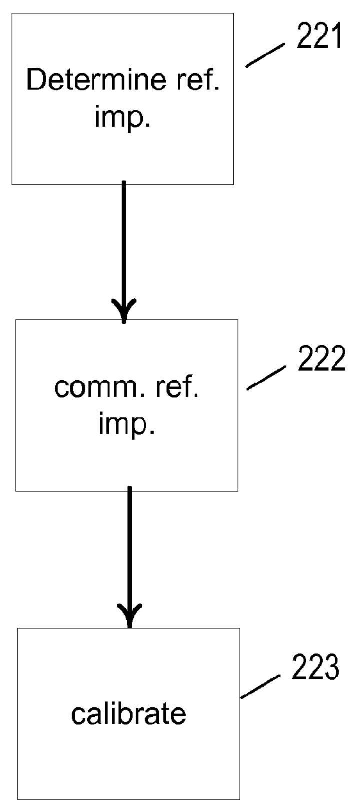
FIG. 4 shows a flow diagram of an impedance calibration method for an IO driver.

FIG. 4 shows a flow diagram of an impedance calibration method 400 for an IO driver. The displayed method 400 at least comprises the three main stages 221, 222, 223 as already described above with reference to FIGS. 2 and 3. In a reference stage 221, the reference partial driver cell 204 determines the reference impedance of the external resistor 103. Subsequently, the reference partial driver cell 204 communicates the determined reference impedance to the IO partial driver cells 207 in communication stage 222. During the communication stage, the reference partial driver cell 204 may communicate the exact value of the reference impedance or some derivative value that can also be used for calibrating the IO driver cells 202. In the examples described above, the communication of such values takes place via a data bus 205, but other communication methods may also be applied. At the calibration stage 223, the IO partial driver cells 207 calibrate their respective IO driver cells 202 based on the communicated values and the specific needs of said IO driver cells. This way, each IO driver cell 202 is calibrated in accordance with its own needs, even when different data channels require different signaling levels.

Figure 5:
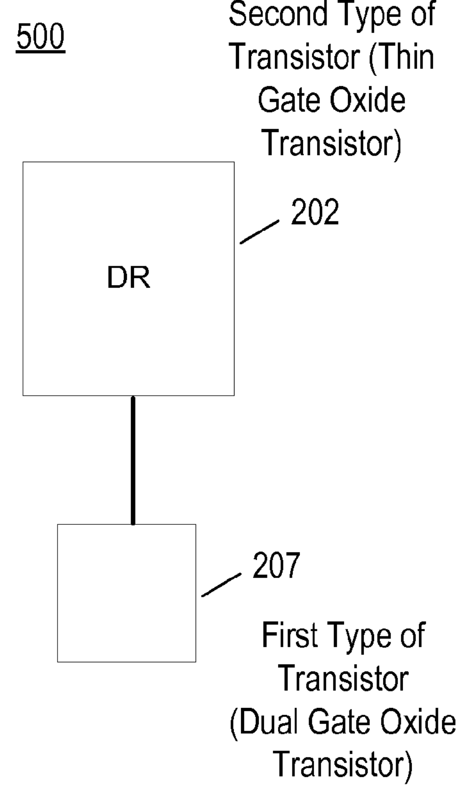
FIG. 5 is an illustration of an example embodiment of a driver cell coupled to a partial driver cell.

FIG. 5 shows an example embodiment 500 of an IO driver cell 202 coupled to an IO partial diver cell 207. As shown in 500, IO driver cell 202 and IO partial driver cell 207 may comprise different types of transistors. For example, IO partial driver cell 207 may be a first type of transistor which may be a dual gate oxide transistor with a relatively low variation in parameters across transistors, while IO driver cell 202 may be a second type of transistor which may be a thin oxide transistor with relatively high variation in parameters across transistors.

Because the apparatus implementing the present invention is, for the most part, composed of electronic components and circuits known to those skilled in the art, circuit details have not been explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 2 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of the IO driver are circuitry located on a single integrated circuit or within a same device. Alternatively, the IO driver may include any number of separate integrated circuits or separate devices interconnected with each other. For example, memory may be located on a same integrated circuit as masters and or on a separate integrated circuit or located within another peripheral or slave discretely separate from other elements of the IO driver. Peripheral and I/O circuitry may also be located on separate integrated circuits or devices. Also for example, the IO driver or portions thereof may be soft or code representations of physical circuitry or of logical representations convertible into physical circuitry. As such, the IO driver may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An IO driver for an integrated circuit, the IO driver comprising:

- a plurality of IO driver cells for controlling IO operations for a corresponding plurality of data channels of the integrated circuit;
- a plurality of IO partial driver cells, respectively coupled to the plurality of IO driver cells, wherein an IO partial driver cell comprises a first type of transistor and its respective IO driver cell comprises a second type of transistor, different from the first type;
- an external resistor for providing a reference impedance; and
- a reference partial driver cell coupled to the external resistor and being arranged to determine the reference impedance and to provide information depending on the reference impedance to the IO partial driver cells,
- the IO partial driver cells being arranged to calibrate the respective IO driver cells based on the provided information.

2. An IO driver as claimed in claim 1, further comprising a calibration engine, coupled to the plurality of IO partial driver cells and to the reference partial driver cell for controlling calibration of the IO driver cells.

3. An IO driver as claimed in claim 1 wherein an on-chip variation of the first type of transistor is significantly narrower than an on-chip variation of the second type of transistor.

4. An IO driver as claimed in claim 3, wherein the first type of transistor is a dual gate oxide transistor and the second type of transistor is a thin gate oxide transistor.

5. An IO driver as claimed in claim 1, wherein the IO partial driver cell is integrated with its respective IO driver cell.

6. A method for calibrating a plurality of IO driver cells of an IO driver, the method comprising:

- a reference partial driver cell determining a reference impedance of an external resistor;
- the reference partial driver cell providing information depending on the reference impedance to IO partial driver cells respectively coupled to the plurality of IO driver cells; and
- the IO partial driver cells calibrating the respective IO driver cells based on the provided information, wherein an IO partial driver cell comprises a first type of transistor and its respective IO driver cell comprises a second type of transistor, different from the first type.

* * * * *